(12) United States Patent
Ghosh

(10) Patent No.: US 10,976,789 B2
(45) Date of Patent: Apr. 13, 2021

(54) SYSTEMS AND METHODS FOR THERMAL MANAGEMENT OF MULTILAYERED INTEGRATED CIRCUITS

(71) Applicant: Vathys, Inc., Portland, OR (US)

(72) Inventor: Tapabrata Ghosh, Portland, OR (US)

(73) Assignee: Vathys, Inc., Portland, OR (US)

( * ) Notice: Subject to any disclaimer, the term of this patent is extended or adjusted under 35 U.S.C. 154(b) by 91 days.

(21) Appl. No.: 16/208,229

(22) Filed: Dec. 3, 2018

(65) Prior Publication Data

US 2019/0171262 A1 Jun. 6, 2019

Related U.S. Application Data

(60) Provisional application No. 62/594,549, filed on Dec. 5, 2017.

(51) Int. Cl.
| | |
|---|---|
| *G06F 1/20* | (2006.01) |
| *G06F 1/3287* | (2019.01) |
| *G06F 1/329* | (2019.01) |
| *H01L 23/34* | (2006.01) |

(52) U.S. Cl.
CPC ............. *G06F 1/206* (2013.01); *G06F 1/329* (2013.01); *G06F 1/3287* (2013.01); *H01L 23/34* (2013.01)

(58) Field of Classification Search
CPC .......... G06F 1/20; G06F 1/206; G06F 1/3287; G06F 1/329; G06F 9/5094; H01L 23/34
See application file for complete search history.

(56) References Cited

U.S. PATENT DOCUMENTS

| | | | |
|---|---|---|---|
| 2002/0007463 A1* | 1/2002 | Fung ..................... | G06F 1/3221 713/320 |
| 2005/0180488 A1* | 8/2005 | Rusu ....................... | G01K 7/42 374/141 |
| 2016/0092363 A1* | 3/2016 | Wang ..................... | G06F 1/3287 711/119 |

* cited by examiner

*Primary Examiner* — Terrell S Johnson
(74) *Attorney, Agent, or Firm* — Cognition IP, P.C.; Edward Steakley

(57) ABSTRACT

Thermal management in three dimensional integrated circuits can be difficult. Although three dimensional integrated circuits offer multiple benefits in alleviating back-end-of-the-line (BEOL) interconnect issues by reducing the wire length and reaping resistance-capacitance (RC) quadratic benefits, the thermal issues associated with stacking high performance (and subsequently high-power consumption) dice have so far proven to be prohibitive. Disclosed are methods and devices for efficient thermal management in multilayered ICs by determining thermally dangerous regions and selectively activating them to avoid undesirable temperature effects.

16 Claims, 3 Drawing Sheets

SYSTEMS AND METHODS FOR THERMAL MANAGEMENT OF MULTILAYERED INTEGRATED CIRCUITS

CROSS-REFERENCE TO RELATED APPLICATIONS

This application claims the benefit of priority of U.S. Provisional Application No. 62/594,549 filed on Dec. 5, 2017 entitled "Thermal Multiplexing: A Method of Three Dimensional Chip Thermal Management," content of which is incorporated herein by reference in its entirety and should be considered a part of this specification.

BACKGROUND

Field of the Invention

This invention relates generally to multi layered integrated circuits and more particularly to methods and devices for improved heat dissipation management within multi layered integrated circuits.

Description of the Related Art

Three-dimensional integration of silicon wafer and/or dice has recently gained more interest because it produces more efficient integrated circuits (ICs) suitable for applications demanding efficient transfer of data between memory and processor. Three-dimensional integration in the context of IC manufacturing and/or packaging is a broad term that can apply to technologies such as 3D wafer-level packaging (3DWLP), 2.5D and 3D interposer-based integration, 3D stacked ICs (3D-SiCs), monolithic 3D ICs, 3D heterogeneous integration, and 3D systems integration.

A prevalent issue in the multilayered IC design is proper thermal management. Multilayered ICs can suffer from thermal failure due to heat generated between layers. The stacked and/or layered architecture of 3D ICs can eliminate normal channels of heat dissipation that may otherwise be available in a 2D device. Normal or above-normal intensity device activity can generate heat between layers, where lack of thermally low resistance dissipation paths can lead to overheating, thermal runaway, device failure and/or undesirable device response. Thermal management techniques, such as using power delivery networks for heat removal have been attempted with limited success. Additionally, prior art approaches to thermal management in multilayer devices can be complex and present heavy computational burden on the device. Some prior art solutions, such as CPU throttling based on a monitored temperature are only applicable to specific multilayered devices (e.g., multilayer, multi-core CPUs) and are not useful for other applications of multilayered ICs. Consequently, there is a need for improved thermal management techniques in multilayered IC design.

SUMMARY

In one aspect of the invention, a method of thermal management in a multilayered integrated circuit (IC) is disclosed. The method includes: determining high-power consumption regions in a plurality of layers of the IC; determining thermally dangerous regions, wherein high-power consumption region from one layer substantially overlaps high-power consumption region of another layer; receiving instructions and/or data to be processed in one or more layers of the plurality of layers of the IC; and activating circuitry in the plurality of the layers of the IC, wherein the circuitry in the thermally dangerous regions are activated at different times.

In one embodiment, the method further includes: generating an activation schedule, wherein activating circuitry is further based on the activation schedule and the schedule comprises the timing, order and/or location of the circuitry to be activated.

In another embodiment, the activation schedule is predetermined before receiving instructions and/or data to be processed.

In one embodiment, determining thermally dangerous regions and generating the activation schedule further includes: generating a data structure comprising data sets corresponding to each layer of the plurality of layers, data sets comprising a mapping of die regions to variables related to expected temperature behavior of the IC and/or the die regions; analyzing the data structure in relation to the desired characteristic of expected instructions and/or data to be processed by the IC; and determining timing, order and/or location of activation of circuitry in the die regions to reduce or avoid simultaneous activation of overlapping thermally dangerous regions.

In one embodiment, the method further includes additional activation schedules each corresponding to an expected type of instructions/data to be processed by the IC and choosing an activation schedule based on the received instructions and/or data.

In some embodiments, the activation schedule is further modified based on the received instructions and/or data.

In another embodiment, the activation schedule is determined dynamically based on the received instructions and/or data.

In one embodiment, the method further includes: parsing the received instructions and/or data; generating a predictive thermal map for each layer of the plurality of layers based on the parsing; and generating the activation schedule based at least partly on the predictive thermal map.

In some embodiments, the activation schedule is modified based at least partially on artificial intelligence techniques.

In one embodiment, high-power consumption regions comprise regions with one or more of potentially high concentration of transistor switching activity, interconnect concentration, high amount of leakage power and high supply voltage.

In some embodiments, a multilayered integrated circuit is configured to perform the method of thermal management.

In another aspect of the invention, a non-transitory computer storage is disclosed. The non-transitory computer storage stores executable program instructions that, when executed by one or more computing devices, configure the one or more computing devices to perform operations including: determining high-power consumption regions in a plurality of layers of a multilayered IC; determining thermally dangerous regions, wherein high-power consumption region from one layer substantially overlaps high-power consumption region of another layer; receiving instructions and/or data to be processed in one or more layers of the plurality of layers of the IC; and activating circuitry in the plurality of the layers of the IC, wherein the circuitry in the thermally dangerous regions are activated at different times.

In one embodiment, the non-transitory computer storage further includes instructions for: generating an activation schedule, wherein activating circuitry is further based on the activation schedule and the schedule comprises the timing, order and/or location of the circuitry to be activated.

In another embodiment, the activation schedule is predetermined before receiving instructions and/or data to be processed.

In some embodiments, determining thermally dangerous regions and generating the activation schedule further includes: generating a data structure comprising data sets corresponding to each layer of the plurality of layers, data sets comprising a mapping of die regions to variables related to expected temperature behavior of the IC and/or the die regions; analyzing the data structure in relation to the desired characteristic of expected instructions and/or data to be processed by the IC; and determining timing, order and/or location of activation of circuitry in the die regions to reduce or avoid simultaneous activation of overlapping thermally dangerous regions.

In one embodiment, the activation schedule is further modified based on the received instructions and/or data.

In one embodiment, the activation schedule is determined dynamically based on the received instructions and/or data.

In another embodiment, the non-transitory computer storage further includes instructions for: parsing the received instructions and/or data; generating a predictive thermal map for each layer of the plurality of layers based on the parsing; and generating the activation schedule based at least partly on the predictive thermal map.

In one embodiment, the activation schedule is modified based at least partially on artificial intelligence techniques.

In another embodiment, high-power consumption regions comprise regions with one or more of potentially high concentration of transistor switching activity, interconnect concentration, high amount of leakage power and high supply voltage.

BRIEF DESCRIPTION OF THE DRAWINGS

These drawings and the associated description herein are provided to illustrate specific embodiments of the invention and are not intended to be limiting.

DETAILED DESCRIPTION

Figure 1:
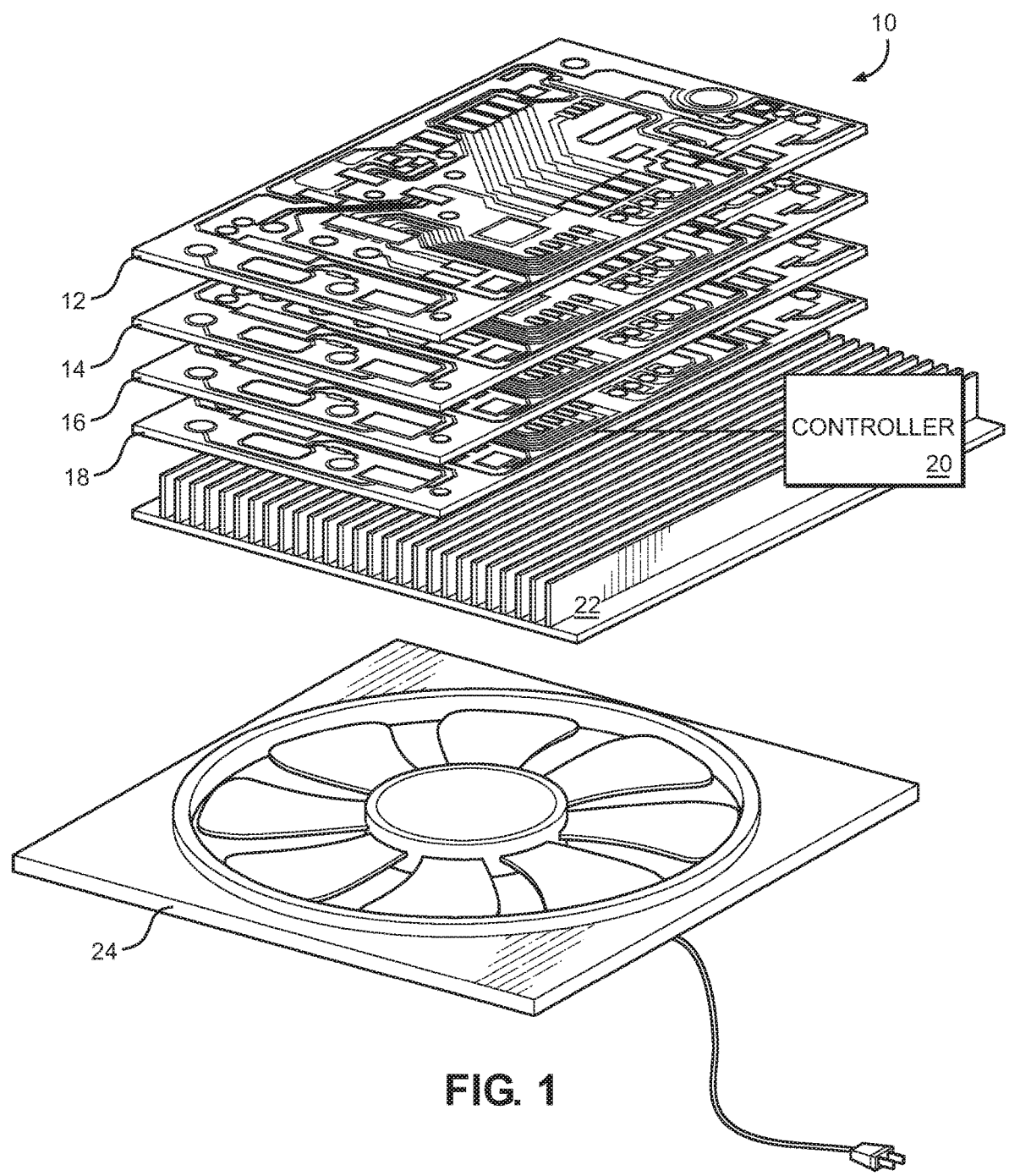
FIG. 1 illustrates a diagram of a multilayered IC the heat management of which can be improved using the embodiments described herein.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements.

Unless defined otherwise, all terms used herein have the same meaning as are commonly understood by one of skill in the art to which this invention belongs. All patents, patent applications and publications referred to throughout the disclosure herein are incorporated by reference in their entirety. In the event that there is a plurality of definitions for a term herein, those in this section prevail.

When the terms "one", "a" or "an" are used in the disclosure, they mean "at least one" or "one or more", unless otherwise indicated.

Before any embodiments are explained in detail, it is understood that the disclosed technology is not limited in its application to the details of construction and the arrangement of components set forth in the following description or illustrated in the following drawings. The disclosed technology is capable of other embodiments and of being practiced or of being carried out in various ways. Furthermore, it is understood that sometimes a different number of apparati, systems and methods may be illustrated and/or described but the disclosed technology may be embodied as containing any number of such aspects. Finally, it should be understood that some embodiments may combine presented aspects. For example, the granularity of the application of the disclosed technology may vary depending upon the embodiment. In another example, the number of layers and/or dice may be greater or less depending on the device implemented by the disclosed multilayered IC.

FIG. 1 illustrates a diagram of a multilayered IC 10 for which the heat management can be improved using the embodiments described herein. Multilayered IC 10 can be used in memory devices, processor devices, microprocessor devices, application specific processors, application specific integrated circuits (ASICs), combined memory and processor IC optimized for matrix operations and/or any other device or combination of devices for which a layered architecture may provide improved efficiency. For example, several modern applications, such as artificial intelligence (AI) and data processing can benefit from significantly shorter distances between memory and the processor in a multilayered IC embedding both memory and processor in the same device.

Multilayered IC 10 includes two or more layers 12, 14, 16 and 18 depending on the underlying functionality. Layers 12, 14, 16 and 18 can include one or more memory (RAM, DRAM, etc.) layers, controller layers, cache layers, processing layers and/or other layers implementing electronic circuitry. Layers 12, 14, 16 and 18 can each include electronic circuitry, interconnects, power supply lines, signal lines and/or other wiring inter/intra layers to enable electronic communication between components. Components in each layer may include transistors, resistors, inductors and/or capacitors implementing memory, logic circuit and/or other functionality. In some embodiments, the layers are electrically connected and communicate via wireless components and techniques, for example, capacitive coupling, inductive coupling, electromagnetic radiation and/or other techniques.

An example controller 20 can include circuitry, hardware and/or software to control one or more operations of a single layer or multiple layers. Controller 20 and/or similar circuits or instances of the controller 20 can be off-chip and/or on-chip on each layer or on some layers and not all layers depending on the functionality of the IC 10. For example, in a processor layer, the layer may include transistors, electrical components and circuitry to implement adders, multipliers, shifters, data registers, program sequencers, instruction caches, data buses, address buses, power supply lines, etc. Controller 20 can include an arithmetic logic unit (ALU). In some embodiments, the controller 20 can be configured to include thermal management hardware implementing the disclosed techniques via hardware circuitry and/or stored software.

The multilayered IC 10 can additionally include one or more heat management components such as heat sinks (e.g., heat sink 22) and one or more cooling fans (e.g., cooling fan 24). The placement of heat sink 22 and cooling fan 24 are for illustration purposes. There may be more than one heat sink, there may be circular heat sinks along with multiple fans sandwiching the IC 10 layers. Other heat management techniques may also be present in the IC 10. For example, fluid filled cooling channels, interposers embedded with cooling channels placed between of flanking layers and other heat management techniques may be implemented in the IC 10.

The heat management in multilayered IC 10 can be improved by described embodiments. For example, as will be described, methods such as selective die region activation using static, dynamic and/or hybrid schedules can be employed to improve heat management in the IC 10.

Figure 2:
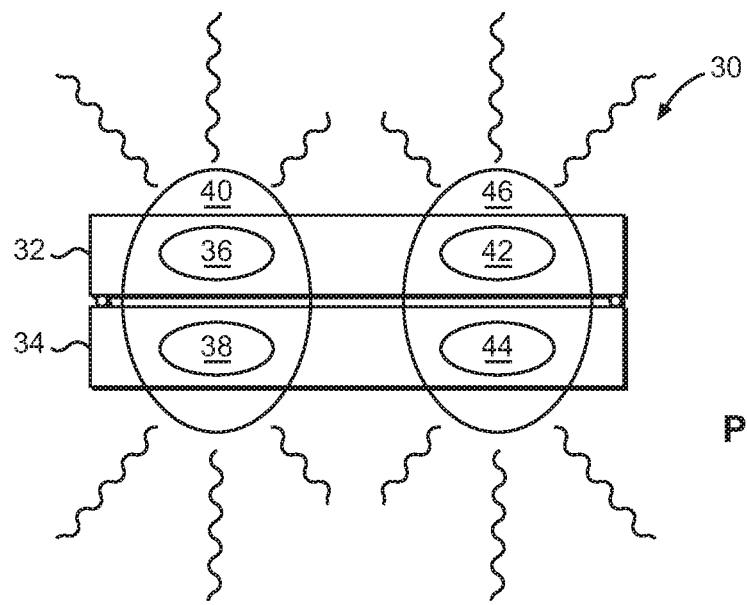
FIG. 2 illustrates a side-view diagram of a prior art multilayered IC.

FIG. 2 illustrates a side-view diagram of a prior art multilayered IC 30. IC 30 includes two dies 32 and 34 substantially vertically stacked. The IC 30 and layers therein can include circuitry to carry out its operations. The circuitry in layers 32 and 34 may be activated and operated without consideration of their thermal behavior. For example, circuitry in the die regions 36, 38, 42 and 44 may be simultaneously activated and operational in high-powered consumption states generating heat. The simultaneously active, high-powered consumption regions 36 and 38 are substantially vertically positioned over each other, overlapping one another and creating a high thermal density region, radiating heat to each other potentially without sufficient low thermal resistance paths for the generated heat to escape. Simultaneously active, high-power consumption regions 36 and 38 can create a thermally dangerous region 40 where the IC 30 may overheat. Lack of consideration to thermal constraints may lead to several overlapping and simultaneously active regions (e.g., regions 42 and 44) creating more thermally dangerous regions (e.g., thermally dangerous region 46) on the IC 30. Notably, if circuitry activation is done without consideration of thermal constraints, the IC 30 can experience multiple thermally dangerous regions despite employing conventional heat management techniques, such as heat sinks, fans, and/or fluid or gas cooled channels.

Activating a region on a die refers to operating, turning on, connecting to electrical power or otherwise making functional the circuitry and/or interconnect embedded in that region. For example, a region in a die may have transistors dedicated to performing matrix multiplication or have transistors implementing a memory functionality. Activating this region entails powering on, commanding or otherwise causing the transistors of the region to perform matrix multiplication functions or if the region is a memory region, activating transistors that function as a memory. Activating a region includes, without limitation, increasing one or any combination of: transistor switching activity, leakage, memory access activity, data processing activity, or instruction processing activity.

Thermally dangerous regions can be present when circuitry in two and/or more substantially overlapping high-power consumption regions are simultaneously activated. Thus, thermally dangerous regions can be reduced or avoided by controlling timing, order and/or location of the activation of circuitry in a multilayered IC, such that no circuitry or fewer circuitry in overlapping high-power consumption regions are simultaneously active. High-power consumption region is any region where activating circuitry therein draws more electrical power relative to regions nearby it. Examples of high-power consumption regions include, regions of the die with potentially high concentration of transistor switching activity, interconnect concentration, high leakage power and/or high supply voltage.

Figure 3:
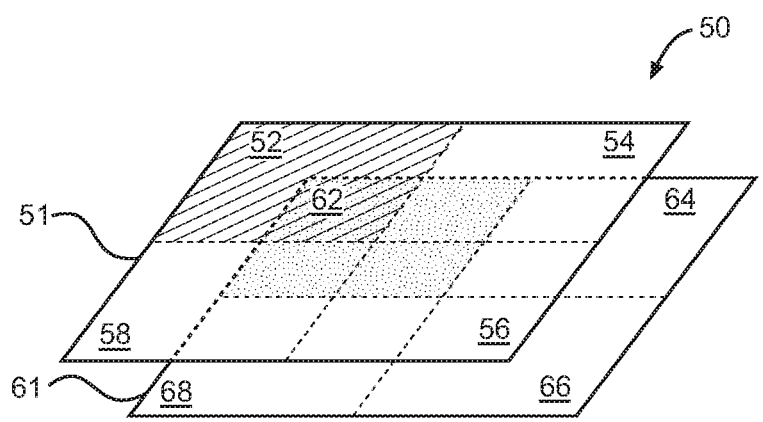
FIG. 3 illustrates a perspective view diagram of a multilayered IC thermally managed according to an embodiment.

FIG. 3 illustrates a perspective view diagram of a multilayered IC 50. For brevity purposes IC 50 is shown with two layers 51 and 61, but more layers are possible and the disclosed thermal management devices and techniques can also be applied or implemented in ICs having more than two layers. High-power consumption regions on each layer of the IC 50 can be detected and mapped based on a variety of factors. For example, an onboard chip can conduct tests during a bootup sequence measuring average or nominal power consumption of various regions of the IC 30 recording the result in a table. Tables and maps of regional power consumptions can be analyzed and overlapping high-power consumption regions detected. For example, in IC 50, region 52 from layer 51 and region 62 from layer 61 may be determined to be substantially overlapping high-power consumption regions such that activating circuitry therein can lead to overheating. Conversely, regions 54, 56, 58 of layer 51 and regions 64,66 and 68 of layer 61 may be determined to not be high-power consumption areas and simultaneously activating the circuitry therein does not lead to thermally dangerous events. The high and normal power consumption regions of the IC 50 do not necessarily fall under geometric boundaries and may occur or be present in irregular and/or non-geometric shapes throughout the layers of the IC 50.

One or more activation schedules can be generated to control the timing, order and/or location of activation of circuitry within the IC 50 and reduce or minimize probability of substantially overlapping high-power consumption regions from being simultaneously active. For example, for a given set of instructions and/or data to be processed by the IC 50, at time t1, the circuitry in region 52 may be activated (e.g., powered, turned on, made operational), while circuitry in the overlapping high-power consumption region 62 is off, deactivated or otherwise made inactive. Circuitry in regions 54, 56, 58, 64, 66 and 68 may or may not be active depending on the instructions and/or data to be processed.

At time t2, the circuitry in region 62 may be activated (e.g., powered on, turned on, made operational), while circuitry in the overlapping high-power consumption region 52 is off, deactivated or otherwise made inactive. Circuitry in regions 54, 56, 58, 64, 66 and 68 may or may not be active depending on the instructions and/or data to be processed.

Static Activation Schedule

In some embodiments, a static activation schedule may be predetermined. For a given multilayered IC structure, the high-power consumption regions in each layer can be determined and mapped. An activation schedule can be generated to avoid simultaneously activating substantially overlapping high-power consumption regions. Static activation schedules can be based on device characteristics and expected instructions and/or data to be processed. For example, a static activation schedule for the IC 50 may be as follows: at time t1, regions 52, 54, 66 and 68 are active and regions 56, 58, 62 and 64 are inactive. At time t2, regions 56, 58, 62 and 64 are active and regions 52, 54, 66 and 68 are inactive. Instructions and/or data can be processed by alternating between time t1 and time t2 activation schedule as described above, thereby avoiding simultaneously activating substantially overlapping high-power consumption regions 52 and 62.

In one embodiment, a data structure D1 can be built to help generate a thermally safe static activation schedule. Data structure D1 can be a matrix structure of multiple data sets, where each data set corresponds to a layer of the multilayered IC. A data set can include die regions and a map of one or more corresponding characteristics of the die regions. For example, a region Rn can be associated with data set (Ln, High_power_consumption, Logic#, Char#), where Ln is a variable denoting the number of the layer of the IC where region Rn is located, variable High_power_consumption can be a binary value denoting whether the region Rn is a high-power consumption region (1) or not (0). The variable Logic# can be a text string variable denoting the type of logic circuitry embedded in region Rn. The variable Char# and/or additional variables can denote other characteristics of the region Rn including characteristics relating to the processing of any expected instructions and/or data. A thermally safe static schedule of activation can be generated by querying, filtering, and/or performing matrix or database operations on the data structure D1 based on desired characteristics corresponding to the instructions and/or data to be processed. Querying, filtering and/or performing matrix or database operations on the data structure D1 can additionally be performed to generate a static activation schedule reducing, minimizing or avoiding overlapping high-power consumption areas. Thresholds, maximums and tolerances can be defined based on the expected data to be processed and/or design characteristics and material used in the multilayered IC.

In another embodiment, the thermally dangerous regions based on power consumption or other factors can be determined at the IC design stage and one or more static activation schedules for the design can be generated and stored in a read only memory (ROM) or similar permanent storage. In some embodiments, multiple static activation schedules each corresponding to a particular set of expected instructions/data can be generated and stored in memory to be recalled and executed when the multilayered IC encounters the expected instructions/data. For example, a first static activation schedule can be predetermined and stored corresponding to matrix operations related to artificial intelligence algorithms; a second static activation schedule can be predetermined and stored corresponding to image processing applications. The static activation schedules can further be designed to enhance IC performance, while reducing or avoiding activating overlapping thermally dangerous regions.

Dynamic Activation Schedule

In some embodiments a dynamic activation schedule can be used to reduce or avoid activating overlapping thermally dangerous regions. The dynamic activation schedule can be a schedule of selective die region activation based on dynamic instructions/data presented to the multilayered IC. In some embodiments, the dynamic activation schedule can further be based on data received from one or more monitoring sensors monitoring on-chip parameters such as junction temperature, ambient temperature, power consumption and/or others.

An example of a dynamic activation schedule includes generating an activation schedule by parsing upcoming cached instructions/data and determining instances where executing and/or processing the instructions/data may lead to activation of overlapping thermally dangerous regions and modifying the timing, order and/or chip location of execution or processing of the instructions/data. In some embodiments, a layer-specific predictive thermal map can be generated by parsing upcoming instructions/data. For example, if upcoming instructions/data include matrix multiplications, a predictive thermal map for the IC layers involved in carrying out the multiplication can be generated. The predictive thermal map can be at least partially based on the size, volume and type of cached or upcoming instructions/data. The predictive thermal map can be analyzed and used to generate a dynamic schedule of activation where activating overlapping thermally dangerous regions are reduced or avoided.

For example, a predictive thermal map of two adjacent layers can reveal potential overlapping thermally dangerous regions. The dynamic schedule of activation can be generated to vary the activation timing and/or order of overlapping thermally dangerous regions, so these regions are activated at different times.

Hybrid Activation Schedule

In some embodiments, a hybrid activation schedule may be employed where embodiments of static and dynamic activation schedules can be combined to avoid activation of overlapping thermally dangerous regions. For example, the data sets of data structure D1 can be modified to further include dynamic variables. For example, a variable Ln_Temp# in the data set associated with Rn can denote an average monitored/detected temperature of the layer Ln where region Rn is located. In another embodiment, the regional temperatures of layers of the multilayered IC can be monitored and a variable Rn_Temp# can denote the temperature of the region in which Rn is located. Both static and dynamic variables of the modified data structure D1 can be used in searching, filtering, and otherwise determining a hybrid activation schedule where activation of overlapping thermally dangerous regions are reduced or are avoided.

Other combinations of static and dynamic activation schedules can include generating a modified predictive thermal map, based on device characteristics (static variables), upcoming instructions/data (dynamic variables) and/or monitored parameters such as junction temperatures, die-specific temperatures, regional temperatures and current power consumption measurements (dynamic variables). A hybrid activation schedule can be generated by analyzing the modified predictive thermal map to reduce or avoid activation of overlapping thermally dangerous regions.

In some embodiments, artificial intelligence techniques can be used to generate and/or improve activation schedules. For example, the device temperature performance after carrying out an activation schedule can be monitored and stored. Variables affecting activation schedules can be modified and fine-tuned using artificial intelligence techniques, such as machine learning.

Figure 4:
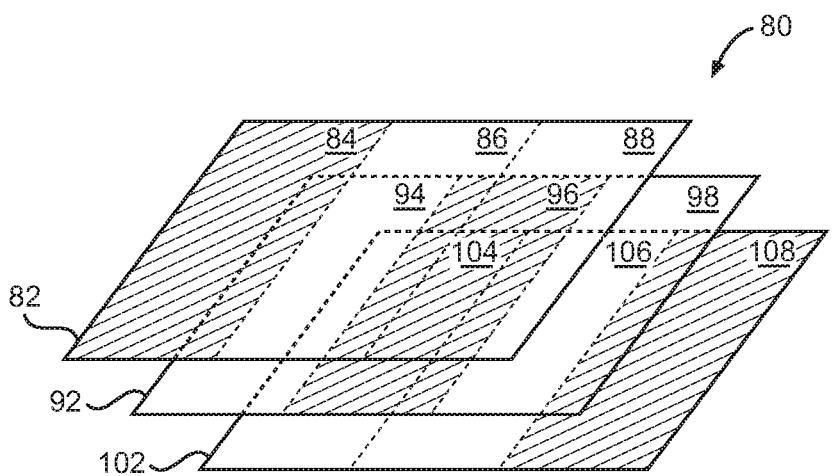
FIG. 4 illustrates a perspective view diagram of another multilayered IC thermally managed according to an embodiment.

The disclosed heat management embodiments can be implemented in a multilayered IC regardless of the number of layers present. FIG. 4 illustrates a three-layer IC 80 including layers 82, 92 and 102. In the illustrated example, all regions 84, 86, 88, 94, 96, 98, 104, 106 and 108 are determined to be high-power consumption regions. Regions 84, 94 and 104 are overlapping thermally dangerous regions where activation of circuitry therein can lead to overheating. Similarly, regions 86, 96 and 106 are overlapping thermally dangerous regions. Regions 88, 98 and 108 are similarly overlapping and thermally dangerous. Static, dynamic and/or hybrid activation schedules, as described above, can be utilized to avoid activating overlapping thermally dangerous regions.

In one example activation schedule, at the time t1 regions 84, 96 and 108 and circuitry therein can be activated and the instructions/data corresponding to those regions executed and/or processed. At the time t2, regions 86, 94 and 108 and circuitry therein can be activated and the instructions/data corresponding to those regions executed and/or processed. At the time t3, regions 88, 96 and 104 and circuitry therein can be activated and the instructions/data corresponding to those regions executed and/or processed. The IC 80 can continue processing instructions/data by repeating the static schedule described above or can continue its operations using other activation schedules generated according to disclosed embodiments.

Figure 5:
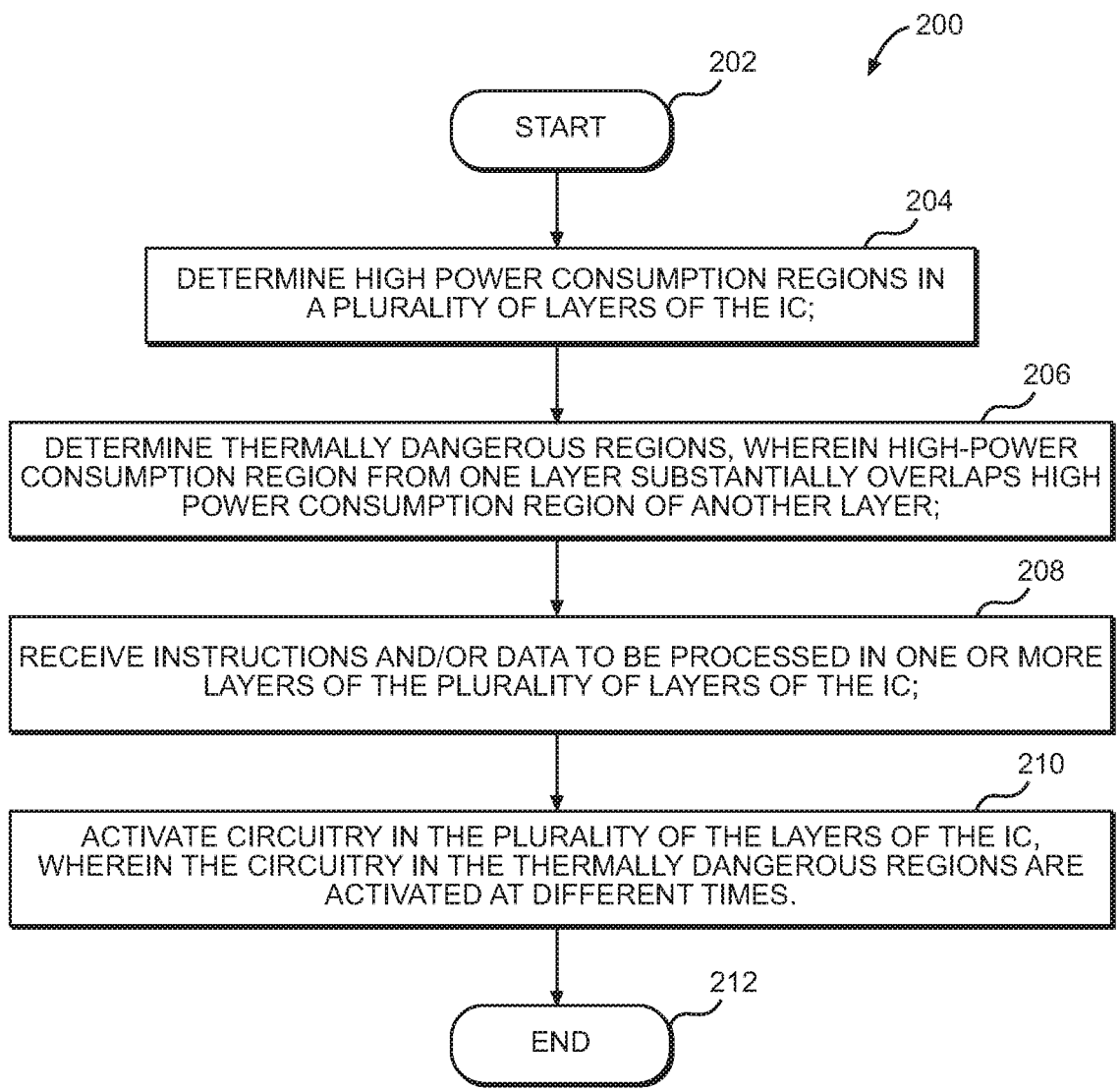
FIG. 5 is an example flow chart of a process of thermal management in a multilayered IC according to an embodiment.

FIG. 5 illustrates a process of heat management 200 in a multilayered IC according to an embodiment. The process 200 starts at the step 202. The process moves to the step 204 by determining high-power consumption regions in a plurality of layers of the multilayered IC. The process then moves to the step 206 by determining thermally dangerous regions, where high-power consumption region from one layer substantially overlaps high-power consumption region of another layer. The process then moves to the step 208 by receiving instructions and/or data to be processed in one or more layers of the plurality of layers of the IC. The process moves to the step 210 by activating circuitry in the plurality of the layers of the IC, wherein the circuitry in the thermally dangerous regions are activated at different times. The process ends at the step 212.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first, second, other and another and the like may be used solely to distinguish one entity or action from another without necessarily requiring or implying any actual such relationship or order between such entities or actions.

The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various implementations. This is for purposes of streamlining the disclosure and is not to be interpreted as reflecting an intention that the claimed implementations require more features than are expressly recited in each claim. Rather, as the following claims reflect, inventive subject matter lies in less than all features of a single disclosed implementation. Thus, the following claims are hereby incorporated into the Detailed Description, with each claim standing on its own as a separately claimed subject matter.

What is claimed is:

1. A method of thermal management in a multilayered integrated circuit (IC), comprising:
    determining one or more high-power consumption regions in a plurality of layers of the IC;
    determining one or more thermally dangerous regions, wherein a respective thermally dangerous region comprises a high-power consumption region from one layer with an overlapping portion with a respective high-power consumption region of another layer;
    receiving instructions and/or data to be processed in one or more layers of the IC;
    generating an activation schedule to define at least one of a timing, an order and a location of respective circuitry to be activated, the activation schedule modifiable based at least partially on one or more artificial intelligence techniques; and
    activating circuitry in the plurality of the layers of the IC, wherein the circuitry in the thermally dangerous regions are activated at different times.

2. The method of claim 1, wherein the activation schedule is predetermined before receiving instructions and/or data to be processed.

3. The method of claim 2, wherein determining thermally dangerous regions and generating the activation schedule further comprises:
    generating a data structure comprising data sets corresponding to each layer of the plurality of layers, data sets comprising a mapping of die regions to variables related to expected temperature behavior of the IC and/or the die regions;
    analyzing the data structure in relation to the desired characteristic of expected instructions and/or data to be processed by the IC; and
    determining timing, order and/or location of activation of circuitry in the die regions to reduce or avoid simultaneous activation of overlapping thermally dangerous regions.

4. The method of claim 2 further comprising additional activation schedules each corresponding to an expected type of instructions/data to be processed by the IC and choosing an activation schedule based on the received instructions and/or data.

5. The method of claim 2, wherein the activation schedule is further modified based on the received instructions and/or data.

6. The method of claim 1, wherein the activation schedule is determined dynamically based on the received instructions and/or data.

7. The method of claim 6 further comprising:
    parsing the received instructions and/or data;
    generating a predictive thermal map for each layer of the plurality of layers based on the parsing; and
    generating the activation schedule based at least partly on the predictive thermal map.

8. The method of claim 1, wherein high-power consumption regions comprise regions with one or more of potentially high concentration of transistor switching activity, interconnect concentration, high amount of leakage power and high supply voltage.

9. A multilayered integrated circuit configured to perform the method of:
    determining one or more high-power consumption regions in a plurality of layers of the IC;
    determining one or more thermally dangerous regions, wherein a respective thermally dangerous region comprises a high-power consumption region from one layer with an overlapping portion with a respective high-power consumption region of another layer;

receiving instructions and/or data to be processed in one or more layers of the IC;

generating an activation schedule to define at least one of a timing, an order and a location of respective circuitry to be activated, the activation schedule modifiable based at least partially on one or more artificial intelligence techniques; and activating circuitry in the plurality of the layers of the IC, wherein the circuitry in the thermally dangerous regions are activated at different times.

10. Non-transitory computer storage that stores executable program instructions that, when executed by one or more computing devices, configure the one or more computing devices to perform operations comprising:

determining one or more high-power consumption regions in a plurality of layers of the IC;

determining one or more thermally dangerous regions, wherein a respective thermally dangerous region comprises a high-power consumption region from one layer with an overlapping portion with a respective high-power consumption region of another layer;

receiving instructions and/or data to be processed in one or more layers of the IC;

generating an activation schedule to define at least one of a timing, an order and a location of respective circuitry to be activated, the activation schedule modifiable based at least partially on one or more artificial intelligence techniques; and activating circuitry in the plurality of the layers of the IC, wherein the circuitry in the thermally dangerous regions are activated at different times.

11. The non-transitory computer storage of claim 10, wherein the activation schedule is predetermined before receiving instructions and/or data to be processed.

12. The non-transitory computer storage of claim 11, wherein determining thermally dangerous regions and generating the activation schedule further comprises:

generating a data structure comprising data sets corresponding to each layer of the plurality of layers, data sets comprising a mapping of die regions to variables related to expected temperature behavior of the IC and/or the die regions;

analyzing the data structure in relation to the desired characteristic of expected instructions and/or data to be processed by the IC; and determining timing, order and/or location of activation of circuitry in the die regions to reduce or avoid simultaneous activation of overlapping thermally dangerous regions.

13. The non-transitory computer storage of claim 11, wherein the activation schedule is further modified based on the received instructions and/or data.

14. The non-transitory computer storage of claim 11, wherein the activation schedule is determined dynamically based on the received instructions and/or data.

15. The non-transitory computer storage of claim 14 further comprising:

parsing the received instructions and/or data;

generating a predictive thermal map for each layer of the plurality of layers based on the parsing; and generating the activation schedule based at least partly on the predictive thermal map.

16. The non-transitory computer storage of claim 10, wherein high-power consumption regions comprise regions with one or more of potentially high concentration of transistor switching activity, interconnect concentration, high amount of leakage power and high supply voltage.

* * * * *